United States Patent
Sattler

(10) Patent No.: US 8,624,686 B2
(45) Date of Patent: Jan. 7, 2014

(54) MICROMECHANICAL COMPONENT AND METHOD FOR OSCILLATION EXCITATION OF AN OSCILLATION ELEMENT OF A MICROMECHANICAL COMPONENT

(75) Inventor: Robert Sattler, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 326 days.

(21) Appl. No.: 12/733,079

(22) PCT Filed: Jul. 2, 2008

(86) PCT No.: PCT/EP2008/058486
§ 371 (c)(1),
(2), (4) Date: Jul. 1, 2010

(87) PCT Pub. No.: WO2009/019086
PCT Pub. Date: Feb. 12, 2009

(65) Prior Publication Data
US 2010/0264997 A1 Oct. 21, 2010

(30) Foreign Application Priority Data
Aug. 9, 2007 (DE) .......................... 10 2007 037 555

(51) Int. Cl.
*H03B 5/30* (2006.01)
(52) U.S. Cl.
USPC .................. 331/154; 331/116 M; 73/504.12
(58) Field of Classification Search
USPC .................. 331/154–156, 116 M; 73/504.12
See application file for complete search history.

(56) References Cited

U.S. PATENT DOCUMENTS

| | | |
|---|---|---|
| 2005/0128552 A1 | 6/2005 | Yasuda et al. |
| 2005/0253055 A1 | 11/2005 | Sprague et al. |

FOREIGN PATENT DOCUMENTS

| | | |
|---|---|---|
| DE | 101 19 073 | 12/2002 |
| DE | 603 08 752 | 4/2007 |
| JP | 7-92409 | 4/1995 |
| JP | 2002-148536 | 5/2002 |
| JP | 2003-177340 | 6/2003 |
| JP | 2003-207737 | 7/2003 |
| WO | 98/44571 | 10/1998 |

OTHER PUBLICATIONS

Schenk H. et al. : "An electrostatically excited 2D-micro-scanning-mirror with an in-plane configuration of the driving electrodes" 20000123 : 20000123-20000127, Jan. 23, 2000, pp. 473-4781, XP010377173.

*Primary Examiner* — Arnold Kinkead
(74) *Attorney, Agent, or Firm* — Kenyon & Kenyon LLP

(57) ABSTRACT

A micromechanical component and a method for providing the oscillation excitation of an oscillation element of a micromechanical component, the micromechanical component having a frame, which is connected to a carrier substrate by an outer suspension element, in which the frame being tiltable about a first axis and oscillatory about a second axis that is positioned perpendicular to the first axis, and in which the micromechanical component having an oscillation element that is connected to the frame by an inner suspension element, and is tiltable about the second axis, the outer suspension element being provided to be dimensioned in such a way that a first oscillation of the frame about the second axis and a second oscillation of the oscillation element about the second axis have a maximum coupling.

13 Claims, 2 Drawing Sheets

MICROMECHANICAL COMPONENT AND METHOD FOR OSCILLATION EXCITATION OF AN OSCILLATION ELEMENT OF A MICROMECHANICAL COMPONENT

FIELD OF THE INVENTION

The present invention relates to a micromechanical component.

BACKGROUND INFORMATION

It is understood that such micromechanical components are generally known. For example, a micromirror unit is discussed in German patent document DE 603 08 752 T2, in which the micromirror is movable about an axis and being fastened in an inner frame that is movable about an additional axis. The mirror is fastened in a frame, and is excited to oscillations by the frame because of a coupling via suspension elements. The disadvantage of this micromirror unit is that an excitation of the frame to a first oscillation and a simultaneous efficient excitation of the micromirror to a second oscillation at the same excitation frequency is not possible. As a result, only small deflection angles of the micromirror unit are implementable, and the excitation of the micromirror unit to greater deflection angles would require a considerable energy expenditure.

SUMMARY OF THE INVENTION

The micromechanical component according to the present invention, and the method for oscillation excitation of an oscillation of a micromechanical component, according to the alternative independent claims, have the advantage that, compared to the related art, clearly greater deflection angles of the oscillation element and a scaled-down design of the micromechanical component are made possible at lower drive currents. According to the exemplary embodiments and/or exemplary methods of the present invention, the characteristic frequency of the frame is shifted, by a dimensioning adjustment of the outer suspension element, in such a way that the two resonant oscillations are maximally coupled, and consequently a double resonant excitation of the first oscillation and the second oscillation is made possible, having one excitation frequency in a considerably more efficient way compared to the related art. Because of the resonant, and thus efficient excitation of the first oscillation, the excitation of the second oscillation via the inner suspension element using the excitation frequency is considerably more efficient, compared to the related art, and larger deflection angles of the oscillation element are achieved using lower driving forces.

The coupling between the first and the second oscillation is established by the stiffness of the outer suspension element, the stiffness being selected, by suitable dimensioning of the outer suspension element, in such a way that the resonant frequency of the first oscillation lies within the half width of the resonance curve of the second oscillation. An oscillation excitation has the maximum efficiency in the vicinity of the resonant frequency, so that the double-resonant oscillation excitation of the first and second oscillation has a considerably higher efficiency compared to the related art. The half width, within the meaning of the exemplary embodiments and/or exemplary methods of the present invention, defines a narrow frequency band about the resonant frequency, the resonant frequency being that frequency at which the frequency curve has a maximum, and at which, in the frequency band, the excitation of an oscillation has a maximum efficiency.

Advantageous embodiments and further refinements of the present invention may be derived from the dependent claims and the description with reference to the drawings.

According to one further refinement, the coupling between the first and the second oscillation is at a maximum, so that, in an especially advantageous manner, a comparatively efficient oscillation excitation of both the first and the second oscillation is achieved. The coupling becomes a maximum especially if the stiffness of the outer suspension element deviates maximally by 20% from a product of the mass of the outer frame and the square of a second resonant frequency with respect to an uncoupled oscillation of the oscillation element about the second axis, which may be maximally by 10%, and especially which may be maximally by 5%.

According to one refinement of the micromechanical component, the frame has at least one printed circuit trace, in the position of equilibrium of the frame, the printed circuit trace forming a current loop in a plane that is parallel to the main extension plane along the frame and about the oscillation element. In the case of a present electrical potential difference and its sustaining by an outer magnetic field, the current loop effects a Lorentz force which acts upon the frame, and is a function of the direction and the absolute quantity of the current intensity in the printed circuit trace and the magnetic field. If a homogeneous magnetic field is present, the action of force on two frame parts lying opposite to each other in the main extension direction is the same in absolute value, but diametrically opposed, since the current flow in the frame parts is also equal in absolute value, but diametrically opposite in direction.

Because of this, a torque acts upon the frame about the first and/or the second axis, and is transmitted to the oscillation element via the inner suspension element. According to the exemplary embodiments and/or exemplary methods of the present invention, a double-resonant oscillation excitation is provided about the second axis, so that lower driving forces, in comparison to the related art, achieve greater deflection angles of the oscillation element.

According to another further development, the oscillation element has a micromirror, the oscillation element itself particularly being a micromirror. Because of that, the micromechanical component is advantageously able to be used as a movable micromirror unit for the reflection and the projection of a light beam, especially in video screen technology, the quality of the imaging being considerably improved by comparatively large mirror deflection angles.

A further subject matter of the exemplary embodiments and/or exemplary methods of the present invention is a method for oscillation excitation of an oscillation element of a micromechanical component, the first oscillation and the second oscillation being excited using one excitation frequency. This double-resonant excitation of the frame advantageously makes possible a considerably more efficient excitation of the oscillation element, compared to the related art, and consequently, especially greater angular deflections of the oscillation element using lower currents and a smaller design of the micromechanical component.

According to another refinement, the excitation of the first and the second oscillation takes place using a periodic current intensity variation, having the excitation frequency in the printed circuit trace and while a magnetic field is applied. The current intensity variation brings about the Lorentz force, which exerts the torque on the frame, and effects the second oscillation. Based on the double-resonant excitation, the second oscillation is excited by the first oscillation, via the coupling of the inner suspension element, in a particularly efficient manner, and a comparatively high efficiency is achieved when the excitation energy is converted to oscillation energy.

According to yet another refinement, the excitement of a third oscillation of the frame about the first axis takes place using an additional excitation frequency. A deflection, or rather a tilting of the frame or the oscillation element about the first axis and simultaneously about the second axis is thus advantageously made possible.

According to a still further refinement, the excitation of the third oscillation takes place using a periodic current intensity variation having the additional excitation frequency in the printed circuit trace and while the magnetic field is applied, a Lorentz force acting upon the frame being induced in such a way that the frame experiences a torque with respect to the first axis. Because of the periodic variation of the current intensity in the printed circuit trace having the additional excitation frequency, the frame and, because of the coupling via the inner suspension element, also the oscillation element, are excited to the third frequency, as a result.

According to one more refinement, the excitation of the first, the second and the third oscillation takes place using a superposition of two periodic current intensity variations having an excitation frequency and the additional excitation frequency in the printed circuit trace, and while a magnetic field is applied. Thus, in a simple manner, the excitation of the first, second and third oscillation is advantageously achieved.

Exemplary embodiments of the present invention are depicted in the drawings and described in greater detail in the subsequent description.

DETAILED DESCRIPTION

Figure 1:
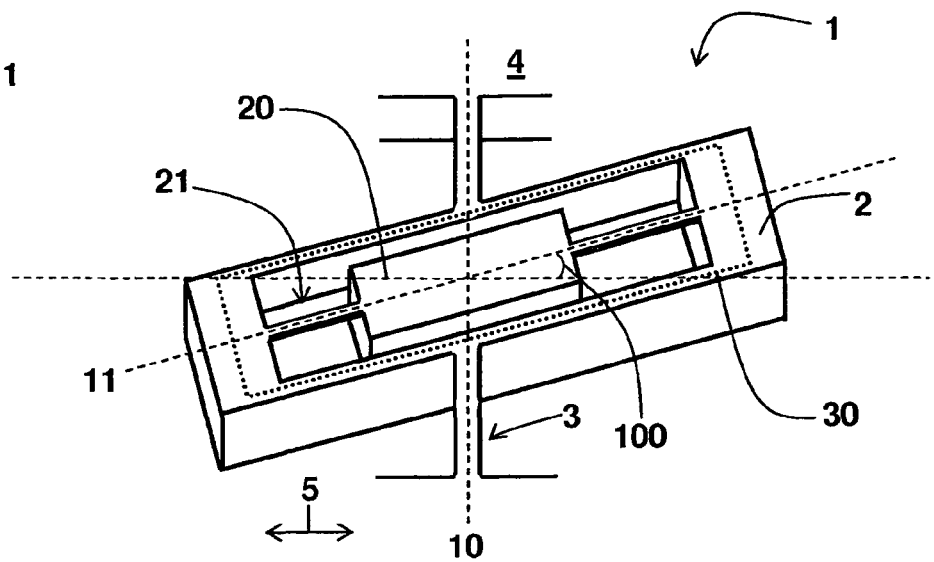
FIG. 1 shows a schematic representation of a micromechanical component, according to the present invention, as in a first specific embodiment, an exemplary angular deflection of a third resonant oscillation of a frame about a first axis being shown.

In the various figures identical components have always been provided with the same reference numerals and thus are usually also labeled only once.

FIG. 1 shows a schematic representation in perspective, of a micromechanical component 1 according to the present invention, in a first specific embodiment, micromechanical component 1 having a frame 2, which is connected to a carrier substrate 4 by an outer suspension element 3; frame 2 being tiltable about a first axis 10 in a main plane of extension 5 of carrier substrate 4, and being oscillatory in the main plane of extension 5, about a second axis 11, that is perpendicular to first axis 10; and micromechanical component 1 has an oscillation element 20 that is connected to frame 2 by an inner suspension element 21, and is tiltable about second axis 11. In the illustration, frame 2 has an exemplary angular deflection 100 of frame 2 about first axis 10 of a third resonant oscillation of frame 2.

Figure 2:
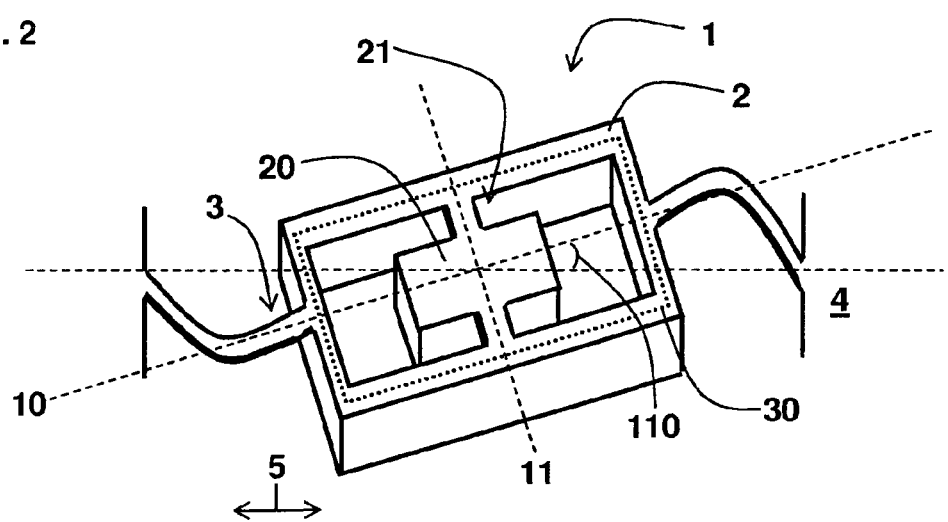
FIG. 2 shows a schematic representation of a micromechanical component, according to the present invention, according to the first specific embodiment, an exemplary angular deflection of a first resonant oscillation of the frame about a second axis being shown.

FIG. 2 shows a schematic representation in perspective, of micromechanical component 1 according to the present invention, in a first specific embodiment, the illustration being shown rotated by an angle of 90° compared to the illustration in FIG. 1, about the surface normal of the main plane of extension 5, and an exemplary angular deflection 110 of frame 2 being shown rotated about second axis 11 of a first resonant oscillation; frame 2 oscillating about second axis 11.

Figure 3:
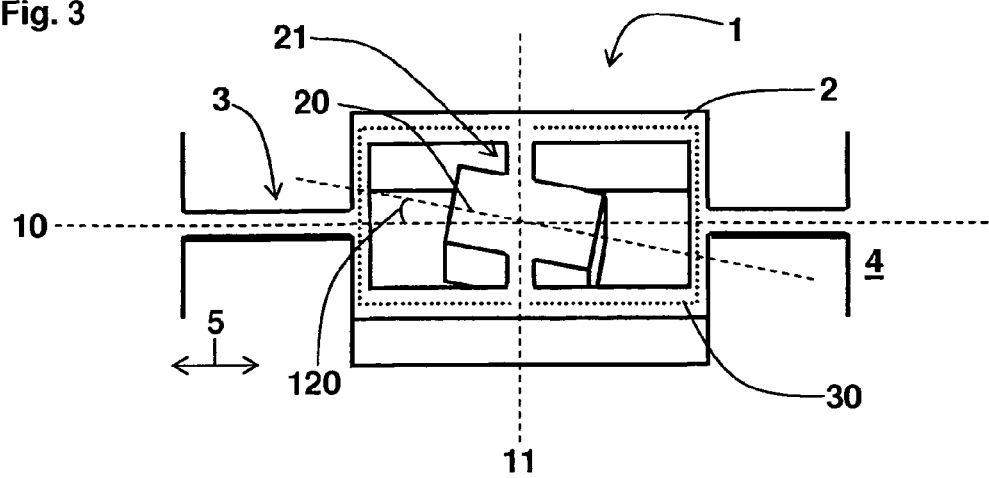
FIG. 3 shows a schematic representation of a micromechanical component, according to the present invention, according to the first specific embodiment, an exemplary angular deflection of a second resonant oscillation of an oscillation element, relative to the frame, about a second axis being shown.

FIG. 3 shows a schematic representation in perspective, of micromechanical component 1 according to the present invention, in a first specific embodiment, the illustration being shown, compared to the illustration in FIG. 2, is an exemplary angular deflection 120 of oscillation element 20 about second axis 11 of a second resonant oscillation, oscillation element 20 oscillating about second axis 11.

Figure 4:
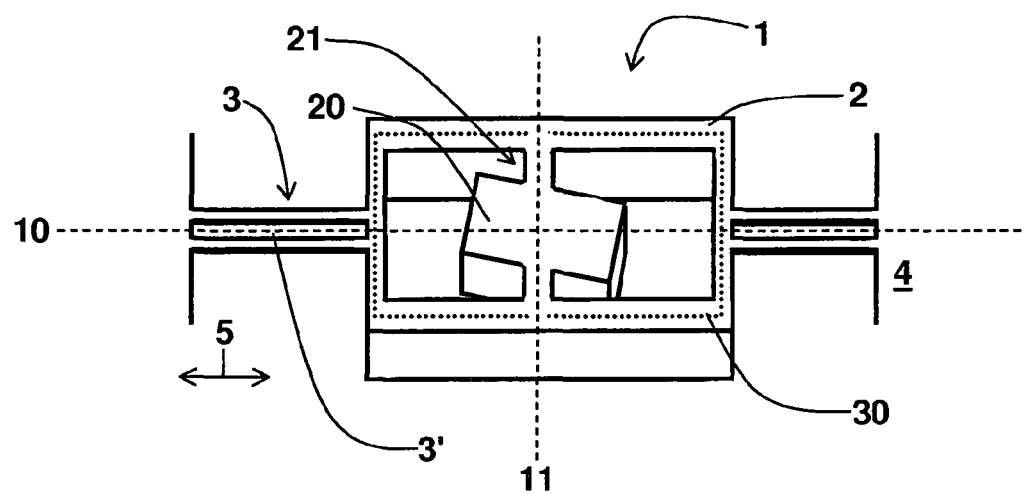
FIG. 4 shows a schematic representation of a micromechanical component according to the present invention, according to a second specific embodiment.

FIG. 4 shows a schematic representation in perspective, of a micromechanical component according to the present invention, in a second specific embodiment, the second specific embodiment differing only in a changed suspension element 3 from the first specific embodiment, which is illustrated in FIGS. 1 through 3. What is shown is an exemplary structure of an outer suspension element 3 which has the required stiffness according to the present invention, so as to shift the resonance curve of the second resonant oscillation in such a way that the two oscillations are strongly coupled.

Figure 5:
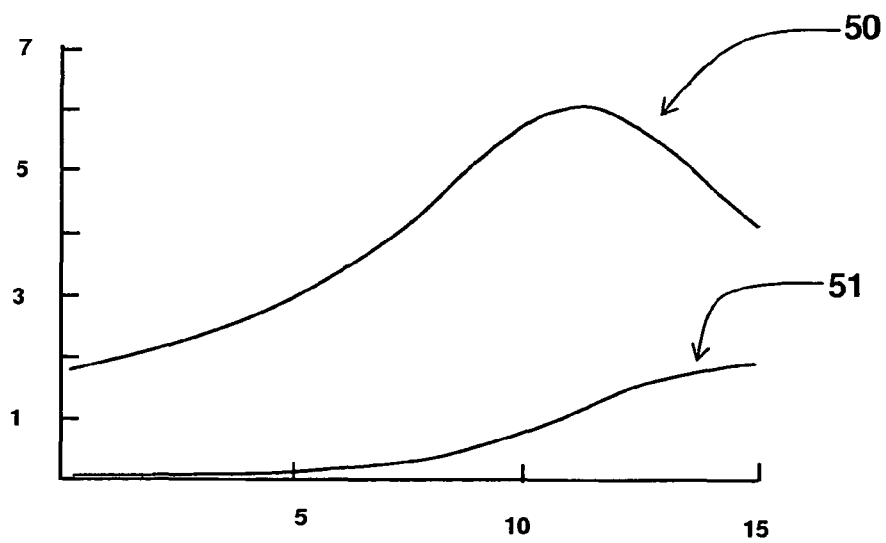
FIG. 5 shows, in an exemplary fashion, the curve of an angular deflection of the frame and of the oscillation element, of the micromechanical component according to the present invention, according to a first specific embodiment, as a function of the relative stiffness of an outer suspension element of the frame.

In a graph, FIG. 5 shows, in an exemplary manner, a curve of an angular deflection of a frame and of an oscillation element connected to the frame, of a micromechanical component according to the present invention, according to the first specific embodiment, as a function of the relative stiffness of the outer suspension element. The relative stiffness of the outer suspension element is plotted on the abscissa, and the angular deflection in degrees is plotted on the ordinate. First functional curve 50 describes the angular deflection of the oscillation element about the second axis, and second curve 51 describes the angular deflection of the frame about a second axis.

According to the exemplary embodiments and/or exemplary methods of the present invention, an appropriate dimensioning of the outer suspension element maximizes the angular deflection of the oscillation element at equal excitation conditions. In the graph shown, the maximum of angular deflection curve 50 of the oscillation element occurs, for instance, at a relative stiffening of eleven. The graph shows that a specified dimensioning, especially as to the stiffening, of the outer suspension element has the effect of maximizing the angular deflection of the oscillation element at equal excitation conditions.

What is claimed is:
1. A micromechanical component, comprising:
a carrier substrate;
an outer suspension element;
an inner suspension element;
a frame which is connected to the carrier substrate by the outer suspension element, the frame being tiltable about a first axis in a main plane of extension of the carrier substrate, and being oscillatory in a main plane of extension about a second axis that is perpendicular to the first axis; and an oscillation element that is connected to the frame by the inner suspension element and is tiltable about the second axis;

wherein the outer suspension element is dimensioned in so that a resonant frequency of a first oscillation of the frame about the second axis lies within a half width of a resonance curve of a second oscillation of the oscillation element about the second axis.

2. The micromechanical component of claim 1, wherein the first oscillation and the second oscillation have a maximum coupling.

3. The micromechanical component of claim 1, wherein the stiffness of the outer suspension element deviates maximally by 20% from a product of the mass of the outer frame and the square of a second resonant frequency with respect to an uncoupled oscillation of the oscillation element about the second axis.

4. The micromechanical component of claim 1, wherein the frame has at least one printed circuit trace, in an equilibrium position of the frame, and wherein the printed circuit trace forms a current loop in a plane along the frame, that is parallel to the plane of main extension, and round about the oscillation element.

5. The micromechanical component of claim 1, wherein the oscillation element has a micromirror.

6. A method for providing an oscillation excitation of an oscillation element of a micromechanical component, the method comprising:

exciting, using one excitation frequency, the oscillation element to provide a first oscillation using one excitation frequency; and exciting, using the one excitation frequency, the oscillation element to provide a second oscillation;

wherein the micromechanical component, having the oscillation element, includes:
a carrier substrate;
an outer suspension element;
an inner suspension element; and
a frame which is connected to the carrier substrate by the outer suspension element, the frame being tiltable about a first axis in a main plane of extension of the carrier substrate, and being oscillatory in a main plane of extension about a second axis that is perpendicular to the first axis, wherein the oscillation element is connected to the frame by the inner suspension element and is tiltable about the second axis, and wherein the outer suspension element is dimensioned in so that a resonant frequency of a first oscillation of the frame about the second axis lies within a half width of a resonance curve of a second oscillation of the oscillation element about the second axis.

7. The method of claim 6, wherein the excitation of the first and of the second oscillation is achieved using a periodic current intensity variation having the excitation frequency in the printed circuit trace and while applying a magnetic field.

8. The method of claim 6, wherein a third oscillation of the frame about the first axis is excited using an additional excitation frequency.

9. The method of claim 8, wherein the excitation of the third oscillation is achieved using a periodic current intensity variation having the additional excitation frequency in the printed circuit trace and while applying a magnetic field.

10. The method of claim 8, wherein the excitation of the first, the second and the third resonant oscillation is achieved using a superposition of two periodic current intensity variations having the excitation frequency and the additional excitation frequency in the printed circuit trace and while applying a magnetic field.

11. The method of claim 6, wherein a third oscillation of the frame about the first axis is excited using an additional excitation frequency, which is one of a static excitation and a resonant excitation.

12. The micromechanical component of claim 1, wherein the stiffness of the outer suspension element deviates maximally by 10% from a product of the mass of the outer frame and the square of a second resonant frequency with respect to an uncoupled oscillation of the oscillation element about the second axis.

13. The micromechanical component of claim 1, wherein the stiffness of the outer suspension element deviates maximally by 5% from a product of the mass of the outer frame and the square of a second resonant frequency with respect to an uncoupled oscillation of the oscillation element about the second axis.

* * * * *

UNITED STATES PATENT AND TRADEMARK OFFICE
CERTIFICATE OF CORRECTION

PATENT NO. : 8,624,686 B2
APPLICATION NO. : 12/733079
DATED : January 7, 2014
INVENTOR(S) : Robert Sattler Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 468 days.

Signed and Sealed this
Twenty-second Day of September, 2015

Michelle K. Lee
*Director of the United States Patent and Trademark Office*